United States Patent
Takeshita et al.

(10) Patent No.: US 12,195,345 B2
(45) Date of Patent: Jan. 14, 2025

(54) SiO POWDER PRODUCTION METHOD AND SPHERICAL PARTICULATE SiO POWDER

(71) Applicant: OSAKA TITANIUM TECHNOLOGIES CO.,LTD.., Hyogo (JP)

(72) Inventors: Kohki Takeshita, Amagasaki (JP); Yusuke Kashitani, Amagasaki (JP); Takehisa Fujita, Amagasaki (JP); Shingo Kizaki, Amagasaki (JP)

(73) Assignee: OSAKA TITANIUM TECHNOLOGIES CO., LTD., Hyogo (JP)

( * ) Notice: Subject to any disclaimer, the term of this patent is extended or adjusted under 35 U.S.C. 154(b) by 678 days.

(21) Appl. No.: 17/267,767

(22) PCT Filed: Aug. 26, 2019

(86) PCT No.: PCT/JP2019/033231
§ 371 (c)(1),
(2) Date: Feb. 10, 2021

(87) PCT Pub. No.: WO2020/045333
PCT Pub. Date: Mar. 5, 2020

(65) Prior Publication Data
US 2021/0309528 A1    Oct. 7, 2021

(30) Foreign Application Priority Data
Aug. 27, 2018 (JP) .................. 2018-158003

(51) Int. Cl.
*C01B 33/18* (2006.01)
*C23C 16/01* (2006.01)
(Continued)

(52) U.S. Cl.
CPC ............ *C01B 33/182* (2013.01); *C23C 16/01* (2013.01); *C23C 16/401* (2013.01); *C23C 16/56* (2013.01);
(Continued)

(58) Field of Classification Search
CPC ..... C01B 33/182; C01B 33/113; C23C 16/01; C23C 16/401; C23C 16/56;
(Continued)

(56) References Cited

U.S. PATENT DOCUMENTS 4,424,193 A * 1/1984 Koyama ............. H01L 21/0262
257/E21.101
2007/0248525 A1* 10/2007 Fukuoka ............... C01B 33/182
423/335
(Continued)

FOREIGN PATENT DOCUMENTS

JP    H09-110412 A    4/1997
JP    2001220123 A *  8/2001    ........... C01B 33/113
(Continued)

OTHER PUBLICATIONS

International Search Report issued in PCT/JP2019/033231; mailed Oct. 15, 2019.

*Primary Examiner* — Nahida Sultana
(74) *Attorney, Agent, or Firm* — Studebaker & Brackett PC

(57) ABSTRACT

[Problem to be solved] To produce an SiO powder having a rounded spherical particulate shape and a small particle diameter; and further having a low degree of impurity contamination, efficiently and economically.

[Solution] A mixture of Si and $SiO_2$ as an SiO gas generation raw material 9 is loaded into a crucible 2. The mixture in the crucible 2 is heated under a reduced pressure so as to generate SiO gas. The generated SiO gas is accumulated on
(Continued)

a deposition base 5 rotating on the crucible 2. When SiO deposit 10 accumulated on the deposition base 5 is scraped off with a blade 7, a tip of the blade 7 is separated from a surface of the deposition base 5, and in a state in which a portion of the SiO deposit 10 accumulated on the deposition base 5 is left on the deposition base 5, the remaining SiO deposit 10 is scraped off by the blade 7 and collected as an SiO powder 11.

10 Claims, 11 Drawing Sheets

(51) Int. Cl.
| | |
|---|---|
| *C23C 16/40* | (2006.01) |
| *C23C 16/56* | (2006.01) |
| *H01M 4/02* | (2006.01) |
| *H01M 4/48* | (2010.01) |

(52) U.S. Cl.
CPC ........... *H01M 4/48* (2013.01); *C01P 2002/54* (2013.01); *C01P 2004/02* (2013.01); *C01P 2004/32* (2013.01); *C01P 2004/61* (2013.01); *C01P 2004/62* (2013.01); *C01P 2006/40* (2013.01); *H01M 2004/027* (2013.01)

(58) Field of Classification Search
CPC ............ C23C 14/0005; C23C 14/0021; C23C 14/588; H01M 4/48; H01M 2004/027; H01M 10/0525; H01M 4/366; H01M 4/483; H01M 4/485; H01M 4/62; C01P 2002/54; C01P 2004/02; C01P 2004/32; C01P 2004/61; C01P 2004/62; C01P 2006/40; Y02E 60/10
See application file for complete search history.

(56) References Cited

U.S. PATENT DOCUMENTS

| | | | |
|---|---|---|---|
| 2016/0079591 A1* | 3/2016 | Yang ................. | C04B 35/62839 427/122 |
| 2018/0257942 A1* | 9/2018 | Takeshita ................. | H01B 1/04 |

FOREIGN PATENT DOCUMENTS

| | | | | |
|---|---|---|---|---|
| JP | 2014-225347 A | 12/2014 | | |
| JP | 2016-519046 A | 6/2016 | | |
| JP | 5994572 B2 * | 9/2016 | ............. | B29C 64/00 |
| JP | 2017-092009 A | 5/2017 | | |
| WO | 2015/004834 A1 | 1/2015 | | |
| WO | WO-2015190372 A1 * | 12/2015 | ............. | B01J 21/04 |

* cited by examiner

SiO POWDER PRODUCTION METHOD AND SPHERICAL PARTICULATE SiO POWDER

TECHNICAL FIELD

The present invention relates to a method for producing an SiO powder used as a negative electrode material for a lithium ion secondary battery and the like, and a spherical particulate SiO powder.

BACKGROUND ART

SiO is known to have a large electric capacity and to be an excellent negative electrode material for a lithium ion secondary battery. This SiO-based negative electrode material is formed into a thin film negative electrode by mixing an SiO powder, an electrically conductive auxiliary agent, and a binder with each other to obtain slurry, applying the slurry to a current collector made of a copper foil and the like, and drying thereof. The SiO powder herein is obtained by heating a mixture of silicon dioxide and silicon to generate SiO gas, and cooling the generated SiO gas to obtain deposit, followed by finely pulverizing the deposit.

Patent Documents 1 to 3 mention that an SiO powder produced by such a deposition method is advantageous because the SiO powder includes many amorphous portions, has a smaller coefficient of thermal expansion, and improves battery characteristics such as cycle characteristics, and, in particular, a rounded SiO powder having a high circularity is effective for improving these battery characteristics.

However, it is not easy to economically produce a rounded spherical particulate SiO powder on an industrial scale. This is because when SiO gas generated by heating a mixture of silicon dioxide and silicon is cooled to be deposited, followed by fine pulverization to obtain an SiO powder, there is a large problem in that the obtained SiO powder is non-spherical particulate particles having corners accompanying pulverization, and a large amount of loss occurs in the process of screening rounded spherical particulate particles from the non-spherical particulate particles having corners, and consequently, the yield is excessively reduced.

In order to solve this problem, in cited reference 1, a jet mill or a cyclone mill for performing fine pulverization using air flow is used, and in cited reference 3, fine pulverization using a ball mill is performed. However, an increase in the cost of pulverization is unavoidable, and the yield is still low. Furthermore, cited reference 2 proposes, in particular, a technique of allowing particles to collide with each other, but an increase in the cost of pulverization is unavoidable.

In addition to these problems, there is an essential problem in that the more elaborately pulverization is performed, the more the chances and frequency of contact with a pulverization container and a pulverization medium are increased, resulting in an increase in the degree of contamination with an impurity in the obtained particles.

Besides these techniques, patent literature 4 and 5 disclose a technique wherein, as a method for producing an SiO powder industrially at a low cost, SiO gas generated by heating a mixture of silicon dioxide and silicon is accumulated on a cooled deposition base, while the accumulated deposit is mechanically scraped off from the deposition base with a blade and collected.

This technique makes it possible to produce an SiO powder from SiO deposit accumulated on the deposition base directly and continuously. Among them, as described in Patent Document 5, when the rotator is used as the deposition base, particularly high production efficiency can be achieved. However, the SiO powder scraped off from the deposition base is scale-shaped particles, and rounded spherical particulate particles cannot be produced directly and continuously. Furthermore, there is also a problem in that the particle diameter in the scale-shaped particle is increased.

CITATION LIST

Patent Literature

[Patent Literature 1] Japanese Unexamined Patent Application, Publication No. 2014-225347
[Patent Literature 2] International Publication WO2015/004834
[Patent Literature 3] Japanese Unexamined Patent Application, Publication No. 2017-92009
[Patent Literature 4] Japanese Unexamined Patent Application, Publication No. 2001-220123
[Patent Literature 5] Japanese Translation of Unexamined Patent Application, Publication No. 2016-519046

SUMMARY OF INVENTION

Technical Problem

An object of the present invention is to provide an SiO production method capable of efficiently and economically producing an SiO powder having a rounded spherical particulate shape and a small particle diameter and further having a low degree of impurity contamination, and an SiO powder having a spherical particulate shape.

Solution to Problem

In view of the above-mentioned object (in particular, reducing the degree of contamination with an impurity in the produced SiO powder), the present inventors have focused on a technique of mechanically scraping off SiO deposit accumulated on a cooled deposition base from the deposition base with a blade. According to this technique, since the blade is brought into contact with the SiO deposit only at the time of scraping off the SiO deposit, it is expected that the chance of contamination with an impurity is reduced and the degree of contamination is reduced. However, even in this scraping technique, whatever the quantity, it is unavoidable that the SiO powder is contaminated with an impurity as a result of mechanical scraping by the blade.

Therefore, the present inventors have assumed that the contamination with an impurity in the mechanical scraping from the deposition base by the blade occurs not only because of contact between the deposit and the blade, but also because of metal-to-metal contact between the cooled deposition base and the blade, and have devised a method for scratching out deposit on the deposition base with the blade separated from the deposition base, and have repeatedly carried out various experiments and considerations. As a result, as compared with a case where deposit on the deposition base is scraped off by bringing the blade into contact with the deposition base, contamination with an impurity is suppressed, and, in addition, it has been found that the deposit scraped off by the blade becomes a powder having a rounded spherical particulate shape and a smaller particle diameter, and is directly and efficiently collected from the deposition base.

In other words, a portion of the SiO deposit accumulated on a cooled deposition base is left on the deposition base, and the remaining SiO deposit is scraped off.

Furthermore, the particle shape of the thus obtained SiO powder is not merely a simple spherical shape having high circularity, but a composite spherical shape like a cauliflower, so to speak, in which a plurality of small spherical satellite parts are integrally combined into a large spherical core part serving as a core, and the outer surface of the core part and the outer surfaces of the satellite parts are relatively smooth (see FIG. 2). Thus, it is proven that it is difficult to identify the particle shape of such a specific composite spherical particle shape by its circularity or Brunauer-Emmett-Teller (BET) specific surface area, which are usually used in the recognition of shapes of the active material particles to be used in batteries; on the other hand, the fractal dimension analysis permits quantitative identification of the specific composite spherical shape, and due to particle shape, SiO powder made of particles having such a specific composite spherical shape has the following excellent characteristics as the negative electrode active material or an intermediate product to be further pulverized and used as negative electrode active material.

In other words, fine powders such as those in the case of deposited SiO being pulverized are not generated, and handling is easy (not easily flying up and not easily getting stuck) because of a composite spherical shape in which a plurality of spherical satellite parts having relatively small diameters is integrated with the spherical core part. Since the specific surface area is appropriately increased, and expansion by the insertion of Li is relieved by an air gap, although the particles are primary particles, they have a feature like secondary particles. As a result, cycle characteristics are mainly improved. When the particles are pulverized before use, since the particles are easily divided at a neck portion, good pulverizability is achieved, and the energy necessary for pulverization is saved.

The present invention has been developed based on a series of such findings. The method for producing an SiO powder includes accumulating SiO gas on a cooled deposition base and scraping off SiO deposit accumulated on the deposition base with a blade, wherein in the scraping, the blade is separated from the deposition base, and a portion of the SiO deposit accumulated on the deposition base is left on the deposition base, and the remaining SiO deposit is scraped off and collected. In other words, from among both surfaces of the SiO deposit accumulated on the deposition base, a contact-side surface that is in contact with the deposition base is kept in contact with the surface of the deposition base, and only a non-contact side surface at the opposite side is scraped off and collected.

In reality, the distance from the deposition base to the blade is fixed, and scraping is repeated over a certain period. Therefore, a process in which SiO deposit having a certain thickness is left on the deposition base, the SiO is newly accumulated thereon, and the accumulated SiO deposit is scraped off, is repeated. As the deposition base, a drum-shaped rotator is preferable from the viewpoint of efficiency. However, SiO powders can be collected even using a flat-shaped deposition base when scraping is repeated with a blade over a certain period.

In the method for producing an SiO powder of the present invention, when the SiO deposit accumulated on the deposition base is scraped off, the blade which is a tool for scraping is not in contact with the surface of the deposition base. As a result, the SiO deposit accumulated on the deposition base is directly collected from the deposition base as a rounded SiO powder having a high circularity. Furthermore, the particle diameter of the SiO powder is small, and the degree of contamination with an impurity is low. The reason therefor is thought to be as follows.

When an SiO deposit accumulated on the deposition base is scraped off with a blade, if a portion of the SiO deposit accumulated on the deposition base is left on the deposition base, a new SiO deposit is accumulated on the remaining SiO deposit, which is then scraped off and collected. In other words, a process in which a certain amount of SiO deposit is left on the deposition base, the SiO is newly accumulated thereon, and the accumulated SiO deposit is scraped off, is repeated. At this time, since the surface of the SiO deposit remaining on the deposition base is a surface after scraping, the surface is in a microscopically rough state including the attachment of fine powders. It is thought that when the SiO deposit is newly accumulated on the microscopically rough surface, the spheroidization of the newly accumulated SiO deposit proceeds with the micro-roughness of the surface as its starting point. When an aggregate of this newly accumulated microspherical SiO deposit is scraped off with a blade, rounded fine SiO powder having high circularity is obtained. Furthermore, contact between the deposition base and the blade is avoided, and thereby, the degree of contamination with an impurity in the SiO powder is reduced.

When the entire amount of the SiO deposit accumulated on the deposition base is scraped off, since the deposit is literally scraped off, the obtained powder does not become spherical, but becomes scale-shaped. Furthermore, even in a case where an SiO deposit is accumulated on the SiO deposit left on the deposition base, when the period of time from accumulation to scraping becomes lengthy, the newly accumulated SiO deposit is integrated with the remaining deposit below. Consequently, the obtained powder still becomes scale-shaped.

From such a viewpoint, in the method for producing an SiO powder of the present invention, the factor d/n (μm), which represents the relationship between the accumulation rate, that is, the growth rate d (μm/min) of the SiO deposit on the deposition base, and the scraping period n (1/min), is important. This is a factor greatly affecting the properties (particle diameter and shape) of the SiO powder collected by scraping from the deposition base, and the factor is desirably 0.5 to 20 μm, further desirably 0.5 to 15 μm, and particularly desirably 1 to 10 μm.

In other words, when the value of d/n (μm) becomes too small, the accumulation of new SiO deposit on the remaining SiO deposit does not proceed; while fine pulverization of the SiO powder obtained by scraping proceeds, thus causing not only deterioration of handling properties, but also excessive increase of a specific surface area of the SiO powder. On the contrary, when the value of d/n (μm) becomes too large, accumulation of new SiO deposit on the remaining SiO deposit proceeds excessively. During this time, integration with the remaining SiO deposit proceeds, and the SiO powder obtained by scraping becomes scale-shaped.

As factors other than d/n (μm), a distance g (mm) from the deposition base to the blade is important. This factor determines a layer thickness of the SiO deposit remaining on the deposition base. If this factor is too small, the layer thickness of the SiO deposit remaining on the deposition base becomes thin, and there is a risk that the SiO powder obtained by scraping may become scale-shaped. On the contrary, if the layer thickness is too great, since the amount of the SiO deposit which is not scraped off and remains on the deposition base increases, the yield is lowered. From these viewpoints, the distance g (mm) from the deposition base to the blade is desirably 0.1 to 3 mm, more desirably 0.5 to 2.5 mm, and particularly desirably 0.5 to 2 mm The material of the blade has an effect on the impurity contamination of a powder product. From the viewpoint of suppressing this effect, the material is preferably stainless steel or ceramic, and is particularly preferably ceramic.

As the stage prior to the scraping step, a raw material of a mixed material of Si and $SiO_2$ as an SiO gas generating raw material needs to be heated under reduced pressure in a reaction chamber to generate SiO gas, and the SiO gas needs to be condensed and deposited to be accumulated on a cooled deposition base. When the pressure in the reaction chamber at this time is too high, a reaction of generating SiO gas from the raw material is not likely to occur. Therefore, the pressure is desirably 10 Pa or less, more desirably 7 Pa or less, and particularly desirably 5 Pa or less.

The temperature t1 (° C.) inside the reaction chamber has an effect on the reaction rate of SiO. When the temperature is too low, the reaction rate becomes slow, and when the temperature is too high, the raw material melts and a reaction area is reduced and similarly the reaction rate becomes slow. Furthermore, the damage to a crucible is also a problem. From this viewpoint, the temperature t1 (° C.) inside the reaction chamber is desirably 1000 to 1600° C., more desirably 1100 to 1500° C., and particularly desirably 1100 to 1400° C.

The temperature t2 of the deposition base has an effect on crystallinity of the SiO deposit (the aggregate of spherical powders) accumulated on the SiO deposit remaining on the deposition base. When this temperature is too low, an organization structure of the SiO becomes too sparse, and a specific surface area is increased. On the contrary, when this temperature is too high, disproportionation occurs. From this viewpoint, this temperature t2 is desirably 800° C. or less, more desirably 150° C. or more and 750° C. or less, and particularly desirably 150° C. or more and 650° C. or less.

In the SiO powder collected by scraping by the blade, by performing heat treatment, the densification of the organization and reduction thereby of the specific surface area proceed. Thus, improvement of the battery performance as a negative electrode material can be expected. Specifically, when the SiO powder is incorporated as an active material into a battery, by reducing the amount of the SEI film growing on the particle surface of the SiO powder, the initial efficiency can be improved. Furthermore, when the SiO powder is coated with electrically conductive carbon, cycle characteristics can be improved.

An atmosphere of the heat treatment herein is desirably an inert gas atmosphere in order to suppress oxidation. A temperature t3 (° C.) of the heat treatment is desirably 500 to 900° C., more desirably 550 to 850° C., and particularly desirably 600 to 850° C. from the viewpoint of optimization of crystallinity. When the temperature t3 (° C.) of the heat treatment is too low, the organization structure of the powder becomes too sparse, and a specific surface area increases. When the temperature t3 (° C.) of the heat treatment is too high, disproportionation occurs. A coating amount of the electrically conductive carbon is preferably 0.5 to 20 wt % in a ratio of the weight of carbon to a total mass of the powder. When the coating amount is too small, an effect of improving cycle characteristics by improvement of conductivity becomes insufficient. If the coating amount is too great, the rate of SiO decreases, and an effect of improving capacity becomes insufficient.

Furthermore, as the raw materials for generating SiO gas, not only a mixture of Si and $SiO_2$, but also materials including other elements in this mixture can be used. When a raw material in which a material including other elements is used, rounded spherical particulate powder can be obtained, and in addition, the SiO powder doped with another element can be produced. Examples of the material including the other element which can be used include metal silicates and metal oxides such as lithium silicate, magnesium silicate, aluminum silicate, lithium oxide, magnesium oxide, and aluminum oxide, or materials such as phosphorus and boric acid used as a so-called dopant. At this time, by adjusting the element ratio of the mixture main body of Si, $SiO_2$, and lithium silicate, Li-doped SiO powder having a desired Li concentration can be obtained.

Furthermore, the spherical particulate SiO powder of the present invention is not only a powder having high circularity, but is also powder having an average value Dfi of the fractal dimensions D of 20 particles of 1.03 or more and 1.50 or less when fractal dimension analysis by a divider method is performed in each sectional surface having a maximum cross-sectional area in 20 particles selected at random. The circularity is preferably 0.8 or more.

Specific examples of the fractal dimension analysis method include a method including preparing a mixture electrode or preparing a cross-sectional surface by an FIB method after resin filling, and performing fractal dimension analysis by a divider method with respect to each cross section of 20 particles selected at random before charging and discharging from a field of view observed under SEM, that is, a method of preparing a mixture electrode using an SiO powder, acquiring a 3D-SEM image with respect to a range including 20 SiO particles to generate a three-dimensional reconstruction image of 20 particles, then calculating each area of the XY cross-section using image analysis software, and calculating the fractal dimension with respect to an XY cross-sectional image having a maximum area of each particle.

The 3D-SEM enables the depth direction information to be continuously acquired by repeating sample processing by FIB, SEM observation, and sample processing at an interval of about 100 nm (acquiring about 400 SEM images). Furthermore, the acquired sequential SEM images are corrected in consideration of the stage inclination angle of the FIB, followed by confirming that a series of SEM images are continuously observed in the depth direction, and then performing alignment of sequential SEM images. Thus, a three-dimensional reconstructed image can be acquired by superimposing the image series.

Each of the SiO particles (20 particles) extracted by the 3D-SEM is subjected to calculation of an area of an XY cross-section (FIB processing direction) using image analysis software Avizo9.7.0 manufactured by Thermo Fisher Scientific, and then Image-Pro10 manufactured by Nippon Roper is used, so that the fractal dimension according to the divider method can be calculated.

As is well known, the fractal dimension according to the divider method is a method for obtaining the fractal dimension by subjecting a contour line to broken line approximation with a line segment having a characteristic length. When N® is the number of line segments required when the contour line of a projected particle image is approximated by a broken line in the set of line segments having a length of r, D in $N® = a \cdot r^D$ is a fractal dimension (a is a coefficient).

In a particle having unevenness on the surface thereof, when the length r of the line segment is made to be smaller, since the unevenness on the particle surface (which does not appear when r is large), appears by means of a broken line approximation, N is increased to more than the reduction amount of r or more. This increase rate is represented by the fractal dimension D, which can represent the complexity of unevenness on the surface of a particle having a composite spherical shape like a cauliflower, so to speak, in which a plurality of small spherical bodies (satellite parts) are integrally combined into a large spherical core part serving as a core (a core part), that is, a particle shape.

As a factor representing the shape of particle of the active material to be used for a battery, circularity and BET equation specific surface area are well known. However, in the case of a composite spherical shape in which a plurality of small spherical satellite portions are integrally combined with a large spherical core part serving as a core, the circularity does not exactly reflect characteristic features. Furthermore, in the case of BET equation specific surface area, since the influence of the surface roughness, which is a microscopic shape, or micro pores is remarkably dominant as compared with the simplicity of a macroscopic shape, a difference is not expressed between the conventional pulverized lump-shaped SiO and the composite spherical shape. On the other hand, the fractal dimension D according to the divider method is not influenced by a microscopic surface area factor, and exactly reflects the characteristic feature of the particles having a composite spherical shape.

When the fractal dimension analysis according to the divider method is performed in a cross-section having the maximum cross-sectional area of each particle for 20 particles selected at random, when the average value Dfi of the fractal dimension D of 20 particles is less than 1.03, a predetermined effect in the particles having a composite spherical shape cannot be obtained because the entire shape is too simple. On the contrary, when the average value Dfi is more than 1.50, neck portions for linking the spherical core part and the spherical shaped satellite part are increased in number and become thinner, and consequently become easily collapsible due to the volume change accompanying charge and discharge. As a result, the cycle characteristics are deteriorated. Furthermore, since new lines and surfaces appear due to the collapse of particles, a side reaction with the electrolytic solution proceeds, and initial efficiency is also deteriorated. The particularly preferable average value Dfi of the fractal dimension D is 1.05 or more and 1.50 or less.

In the spherical particulate SiO powder of the present invention, a magnification rate when the fractal dimension is calculated is important. The magnification is set to a value at which the cross-sectional area of the particles for calculating the fractal dimension occupies 20 to 90% of the field of view. Otherwise, the complicated shape of the contour cannot be seen, and the apparent fractal dimension decreases. On the contrary, if the cross-section having a maximum area does not fall within 20 to 90% of the field of view, the particles are excluded from the calculation subjects of the fractal dimension.

Advantageous Effects of Invention

In the method for producing an SiO powder of the present invention, in a state in which a portion of an SiO deposit accumulated on the deposition base is left on a cooled deposition base, the remaining SiO deposit is scraped off and collected, so that not only SiO powder with a low degree of contamination by an impurity can be produced efficiently and economically, but also rounded SiO powder having high circularity, and further having a small particle diameter can be produced efficiently and economically. When the SiO powder is used as negative electrode material for a lithium ion secondary battery, it can contribute to improvement of the battery performance of an ion secondary battery.

Furthermore, in the spherical particulate SiO powder of the present invention, the characteristic features of the powder particles are macroscopically digitized by a fractal dimension D according to a divider method and properly managed, and thereby the battery performance when the SiO powder is used as a negative electrode material of the lithium ion secondary battery can be efficiently improved.

Furthermore, the spherical particulate SiO powder of the present invention can be used as an intermediate to be further pulverized and used as negative electrode active materials, and is excellent in pulverizability at that time. As a result, the spherical particulate SiO powder reduces pulverization energy and contributes to reduction of the production cost.

DESCRIPTION OF EMBODIMENTS

Hereinafter, the embodiments of the present invention will be described.

A method for producing an SiO powder of this embodiment includes an SiO gas generation step generating SiO gas; an SiO deposition step of condensing and depositing to accumulate the generated SiO gas on a cooled deposition base; and an SiO powder collecting step of scraping off the SiO deposit accumulated on the deposition base with a blade and collecting the scraped deposit as an SiO powder. These steps proceed simultaneously in parallel, and the SiO powder collecting step among these steps has a significant feature.

Figure 1:
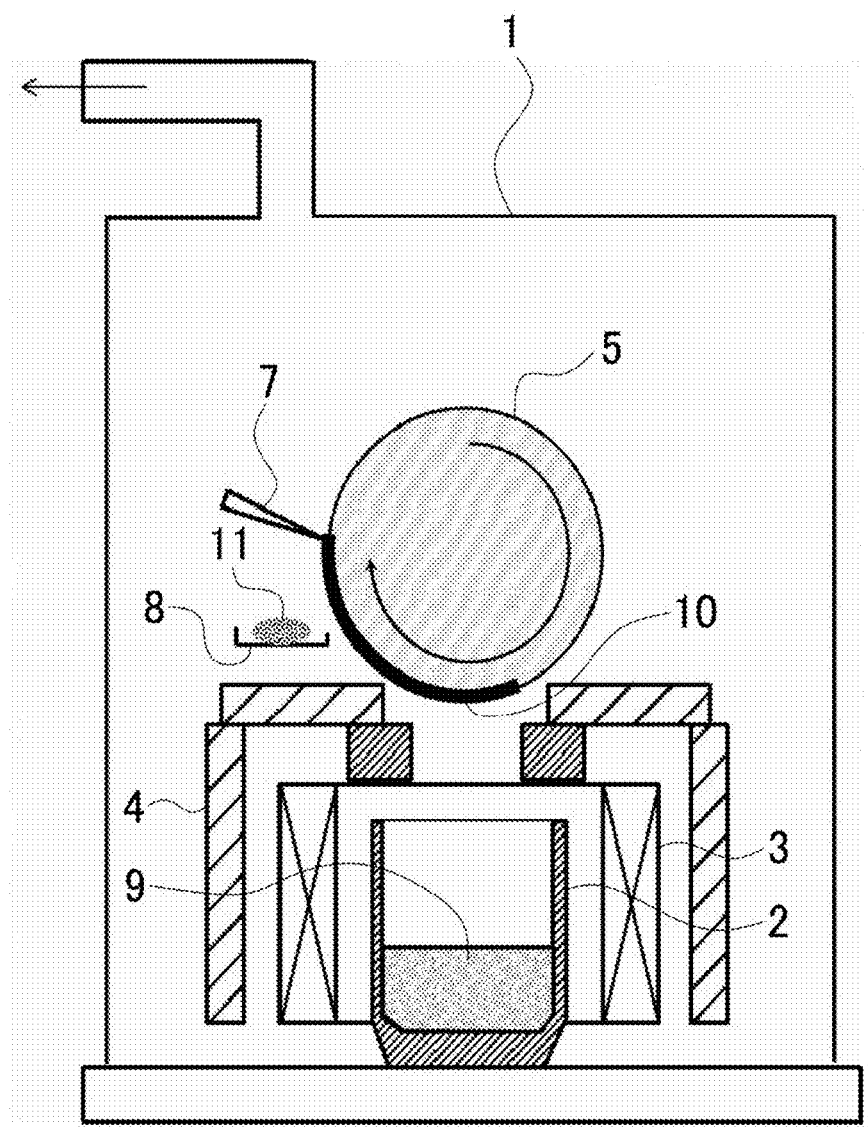
FIG. 1 is a schematic showing an example of an SiO powder production device to be used in a method for producing an SiO powder of the present invention.

As shown in FIG. 1, an SiO powder production device to be used for the method for producing an SiO powder of this embodiment includes a furnace body 1, a crucible 2 placed in the furnace body 1, a heater 3 surrounding the crucible 2 in order to heat the crucible 2, a heat insulator 4 covering these leaving an upper-side opening portion of the crucible 2, a deposition base 5 disposed above the upper-side opening portion of the crucible 2 and including a drum-shaped rotator, a blade 7 disposed from a front surface side of the deposition base 5 toward the deposition base 5 for scraping off an SiO deposit accumulated on the outer circumference of the deposition base 5, and a saucer 8 for the SiO powder disposed at the lower portion of the blade 7.

To produce the SiO powder, firstly, for example, a mixture material of Si and $SiO_2$ as the SiO gas-generating raw material 9 is loaded into the crucible 2, which is a reaction chamber. Then, the inside of the furnace body 1 is heated by the heater 3 while a pressure inside the crucible 2 is reduced. As described above, the pressure inside the crucible 2 is desirably 10 Pa or less, more desirably 7 Pa or less, and particularly desirably 5 Pa or less. Furthermore, a heating temperature of the inside of the crucible 2, that is, a temperature t1 inside the reaction chamber is desirably 1000 to 1600° C., more desirably 1100 to 1500° C., and particularly desirably 1100 to 1400° C.

Heating of the inside of the crucible 2 under reduced pressure generates the SiO gas from the SiO gas-generating raw material 9 inside the crucible 2. This is the SiO gas generation step.

At this time, on the crucible 2, the deposition base 5 including a drum-shaped rotator rotates. A temperature t2 of the deposition base 5 is set to be lower than t1 inside the reaction chamber, in more detail, set to be lower than the condensation temperature of the SiO gas. As described above, the temperature t2 is desirably 800° C. or less, more desirably 150° C. or more and 750° C. or less, and particularly desirably 150° C. or more and 650° C. or less. Thus, the SiO gas generated from an SiO gas-generating raw material 9 inside the crucible 2 is condensed and deposited and accumulated. This is the SiO deposition step.

At the same time, the blade 7 faces the rotating deposition base 5 from the front side. What is important herein is that the tip of the blade 7 is not brought into contact with the surface of the deposition base 5, and a predetermined distance g (gap) is secured between the surface of the deposition base 5 and the tip of the blade 7. As described above, this distance g (gap) is desirably 0.1 to 3 mm, more desirably 0.5 to 2.5 mm, and particularly desirably 0.5 to 2 mm Thus, SiO deposit 10 accumulated on the surface of the deposition base 5 is scraped off by the blade 7, and collected as the SiO powder 11 in the saucer 8. However, since the tip of the blade 7 is not brought into contact with the surface of the deposition base 5, and a predetermined distance g (gap) is secured between the surface of the deposition base 5 to the tip of the blade 7, the collected SiO powder 10 is prevented from being contaminated with an impurity due to direct contact between the deposition base 5 and the blade 7 is prevented, and the SiO powder 11 becomes high quality powder having a rounded spherical particulate shape and having a small particle diameter. The reason therefor is as described before.

This is the SiO powder collecting step, and it proceeds simultaneously in parallel with the SiO gas generation step and the SiO accumulation step, and the high-quality SiO powder described above is continuously produced.

The SiO powder collecting step is described more specifically by focusing a certain position in a circumferential direction of the deposition base 5, with a scraping position by the blade 7 as a starting point. When the certain position reaches the scraping position, the SiO deposit 10 accumulated so far is scraped off, and the Si deposit 10 having a predetermined thickness remains on the surface of the deposition base 5 even after scraping. Then, before the certain position reaches the scraping position, the SiO deposit 10 is accumulated thereon, and the newly accumulated Si deposit 10 is scraped off at the scraping position. This is repeated. In other words, on the surface of the deposition base 5, the Si deposit 10 having a predetermined thickness continues to remain, and the Si deposit 10 newly accumulated thereon is scraped off by the blade 7. During the unit time, the rate at which the SiO deposit 10 is accumulated is a growth rate d (μm/min) of the SiO deposit 10. The number of rotations in the unit time of the deposition base 5 is a scraping period n (1/min).

As described above, the relationship d/n (μm) between the growth rate d (μm/min) of the SiO deposit 10 and the scraping period n (1/min) has a great effect on the property of the collected SiO powder (particle diameter and shape).

Furthermore, the SiO powder thus obtained is not merely a simple spherical particle having high circularity, but is a composite spherical shape like a cauliflower, so to speak, in which a plurality of small spherical satellite parts are integrally combined into a large spherical core part serving as a core. When the particle shape is represented by the average value Dfi of the fractal dimension D of 20 particles, when the value Dfi shows 1.03 or more and 1.50 or less, and particularly shows 1.05 or more and 1.50 or less. The SiO powder is excellent, the cycle characteristics and pulverizability as described above. Furthermore, the circularity is preferably 0.8 or more as described above, from the viewpoint that the powder particle becomes spherical in shape.

The SiO particles preferably have a median diameter of 0.5 to 30 μm. If the particle diameter is too small, the influence of the decomposition reaction of the electrolytic solution on the particle surface increases, which leads to deterioration of the coulomb efficiency and deterioration of the handling properties due to the increase of the cohesiveness and deterioration of the bulk density. When the particle size is too large, expansion of the electrode when Li is occluded increases, and the cycle characteristics are deteriorated.

EXAMPLES

Next, results obtained by actually producing an SiO powder by the above-described device and procedure are described. A deposition base including a drum-shaped rotator is made of stainless steel and subjected to oil cooling, and the blade is a doctor blade made of stainless steel.

Example 1-1

A mixture of Si and $SiO_2$ (Si:O=1:1) as an SiO gas-generating raw material was loaded into a crucible as a reaction chamber, the crucible was set in a predetermined position inside a furnace body, after which the pressure inside the furnace body was reduced to 1 Pa, and the inside of the crucible was heated to 1300° C. to generate SiO gas. At the same time, the deposition base on the crucible was rotated while temperature control at 150° C. was performed to condense and deposit the SiO gas on the surface of the deposition base.

The growth rate d of the SiO deposit, that is, the film formation speed in the surface of the deposition base, was 4.8 μm/min at this time, and by adjusting the rotation speed of the deposition base, the scraping period n was made to be 2.4 $min^{-1}$, and the ratio of both values d/n was made to be 2. Furthermore, a distance g from the surface of the deposition base to the tip end of the blade was 0.5 mm In the position for scraping by the blade, the SiO deposit was scraped off with an SiO deposition layer having a thickness of 0.5 mm left, and the SiO powder was collected.

Thus, the SiO powder was manufactured continuously. Among the manufactured SiO powders, fine powders having 45 μm or less were evaluated as an active material by sieving.

Furthermore, manufacturing capability per unit length of the deposition base of the SiO powder (g/(hr·m)), a yield (weight of collected SiO/amount of weight loss of raw material), collection rate of fine powder (weight amount of the collected SiO by 45-μm sieve/weight of collected SiO) was examined The particle shape of the produced SiO powder was examined for the circularity (circumferential length of circle having equal projected area/circumferential length of a particle). A circularity measurement method is shown in Table 1.

TABLE 1

| Type of measurement | Flow-type particle image analyzer FPIA-3000 device | |
|---|---|---|
| Adjustment of sample | Dispersion medium | 0.2 wt % sodium hexametaphosphate aqueous solution |
| | Dispersion agent (surfactant) | 10 wt % Triton X-100 aqueous solution |
| | Adjustment of sample | Sample amount: 10 mg 0.2 wt % Na-HMP 30 g/10 wt % Triton X-100 aqueous solution: 1 drop |
| | Pretreatment | Ultrasonic bath (150 W) dispersion: 1 min |
| Setting of device | Sheath solution | Particle sheath (manufactured by SYSMEX CORPORATION) |
| | Objective lens | Standard (10×) |
| | Measurement mode | LPF mode |
| | Counting method | Quantitative counting |
| | Number of measurements | Measure three times |
| Analysis conditions | Sample measured by the above method Results of three measurements totalized and subjected to data analysis based on numbers | |

Next, a negative electrode of a lithiu ion secondary battery was prepared by using SiO fine powder of 45 μm or less, which was the final powder product, for a negative electrode active material. Specifically, SiO powder, Ketjen black, and a polyimide precursor, which is a nonaqueous solvent binder, were mixed at a mass ratio of 85:5:10; furthermore, NMP (n methyl pyrrolidone) was added to the mixture, and the obtained mixture was kneaded to prepare slurry. Next, the slurry was applied to a copper foil having a thickness of 40 μm, preliminarily dried at 80° C. for 15 minutes, punched into a diameter of 11 mm, and then subjected to imidization treatment to obtain a negative electrode.

Furthermore, a lithium ion secondary battery was prepared by using the prepared negative electrode. Specifically, a lithium foil was used for the counter electrode in the secondary battery. For the electrolyte, a solution obtained by dissolving $LiPF_6$ (lithium hexafluorophosphate) in a solution obtained by mixing ethylene carbonate and diethyl carbonate at a volume ratio of 1:1, so that the ratio was 1 mol/liter, was used. Then, for a separator, a coil cell was prepared using a porous film made of polyethylene and having a thickness of 20 μm.

The prepared lithium ion secondary battery was subjected to a charge/discharge test using a secondary battery charge/discharge test device (manufactured by Nagano, Co., Ltd.). Test conditions in the charge/discharge test are shown in Table 2. With the charge/discharge test, initial charge capacity, initial discharge capacity, and ratio of the initial discharge capacity in relation to the initial charge capacity (initial Coulomb efficiency), the ratio of the 50th discharge capacity in relation to the initial discharge capacity (capacity retention rate after 50 cycles) were obtained, respectively.

TABLE 2

| | Charge | | Discharge | |
|---|---|---|---|---|
| 1st | CC-CV 0.1 C | 5 mV – 0.01 C | CC 0.1 C | 1.5 V |
| 2nd | CC-CV 0.3 C | 5 mV – 0.01 C | CC 0.3 C | 1.5 V |
| 3rd-50th | CC-CV 0.5 C | 5 mV – 0.01 C | CC 0.5 C | 1.5 V |

In order to evaluate the particle shape of the SiO powder, in addition to the measurement of the circularity described above, the above-described negative electrode was subjected to acquirement of a 3D-SEM image and the fractal analysis of the SiO particle cross-section were performed according to the method mentioned below.

(1) A 3D-SEM image was acquired for the electrode.
Device for sample preparation and observation: Helios G4 manufactured by FEI
FIB processing condition: acceleration voltage 30 kV
SEM observation condition: acceleration voltage 2 kV secondary electron image
Processing area: about 40 μm (width)×about 40 μm (height)
Slice Step: 100 nm
Number of Slices: about 400
Sample inclination: 52°

(2) Sample processing by FIB, SEM observation, and sample processing were repeated at an interval of about 100 nm (acquiring about 400 SEM images) to continuously obtain thickness information of about 40 μm in the depth direction. Furthermore, the acquired sequential SEM images were corrected in consideration of the stage inclination angle of FIB. After confirming that a series of SEM images were continuously observed in the depth direction, alignment of sequential SEM images was performed, and image series were superimposed to acquire a three-dimensional reconstructed image. Observation range was selected so that 20 particles were included in the observed field of view.

(3) Then, the fractal dimension analysis was performed as follows.
Software Used:
Avizo9.7.0 manufactured by Thermo Fisher Scientific
Image-Pro10 manufactured by Nippon Roper
Image Analysis Method:
An area of each of the XY cross-section (the FIB processing direction) of the SiO particles (20 particles) extracted by the 3D-SEM was calculated using Avizo9.7.0. For each particle, the fractal dimension D of each particle was calculated from the XY cross-sectional image having the maximum area using Image-Pro10, and the average values were compared.

Furthermore, beside these measurements, the pulverizability was examined by the following method in consideration of further pulverizing the SiO powder and using the SiO powder as an active material.

(1) The particle size distribution of the collected powders sifted through a sieve having a mesh opening of 45 μm was measured, and the median diameter D50 (hereinafter, referred to as average particle size) based on the volume was obtained. The particle size distribution is measured by using a laser diffraction type particle size distribution measurement apparatus. In this Example, Mastersizer2000 manufactured by Malvern was used. For the solvent, isopropylalcohol was used.

(2) The powder sifted through a 45-µm sieve was pulverized to a particle size of 5 µm using a dry-type attritor. The used device was a dry-type attritor MAID manufactured by NIPPON COKE & ENGINEERING CO., LTD., the ball used was a material of zirconia having a diameter of 5 mm, and the number of rotations was 300 rpm. The time taken to reach the desired particle size (5 µm) was measured.

Various types of examination results, such as specifications of the produced SiO powder, manufacturing properties, battery performance, and pulverizability, are shown in Table 3 together with the production conditions of the SiO powder.

Example 1-2

In Example 1-1, the rotation speed of the deposition base was reduced, the scraping period n was changed from 2.4 $min^{-1}$ to 0.24 $min^{-1}$, and accordingly, d/n was changed from 2 to 20. The other production conditions and examination methods were the same as those in Example 1-1. Various examination results are shown in Table 3 together with the production conditions of the SiO powder.

Example 1-3

In Example 1-1, the rotation speed of the deposition base was increased, the scraping period n was changed from 2.4 $min^{-1}$ to 48 $min^{-1}$, and accordingly, d/n was changed from 2 to 0.1. The other production conditions and examination methods were the same as those in Example 1-1. Various examination results are shown in Table 3 together with the production conditions of the SiO powder.

Example 2

In Example 1-1, a distance g from the surface of the deposition base to the tip of the blade was changed from 0.5 mm to 1 mm. The other production conditions and examination methods were the same as those in Example 1-1. Various examination results are shown in Table 3 together with the production conditions of the SiO powder.

Example 2-i

In Example 2, the prepared final product (SiO fine powder) was subjected to heat treatment. Specifically, the final product (SiO fine powder) was loaded into a crucible made of alumina, and heated in an electric furnace in an inert gas atmosphere (Ar gas atmosphere) at 850° C. for two hours. The other conditions were the same as those in Example 2. Various examination results are shown in Table 3 together with the production conditions of the SiO powder.

Example 2-ii

In Example 2-i, the final product (SiO fine powder) after heat treatment was coated with electrically conductive carbon (C-coating). Specifically, the powder after heat treatment was loaded into a rotary kiln, and carbon coating treatment was performed by a thermal CVD using a mixed gas of argon and propane as a carbon source. A carbon coating amount (weight ratio of the C element to the entire powder) was 2 wt %. The other conditions were the same as those in Example 2-i. Various examination results are shown in Table 3 together with the production conditions of the SiO powder.

Example 3

In Example 2, a distance g from the surface of the deposition base to the tip of the blade was changed from 1 mm to 3 mm. The other production conditions and examination methods were the same as those in Example 2. Various examination results are shown in Table 3 together with production conditions of the SiO powder.

Example 4

In Example 3, the temperature of the deposition base was changed from 150° C. to 500° C. Accordingly, the film formation speed was lowered from 4.8 µm/min to 4.5 µm/min, and d/n was lowered from 2 to 1.88. The other production conditions and examination methods are the same as those in Example 3. Various examination results are shown in Table 3 together with the production conditions of the SiO powder.

Example 5

In Example 1, the SiO gas-generating raw material was changed from the mixture of Si and $SiO_2$ (Si:O=1:1) to a mixture of Si, $SiO_2$, and lithium silicate (Li:Si:O=0.1:1:1). Furthermore, the distance g from the surface of the deposition base to the tip of the blade was changed from 0.5 mm to 0.1 mm. The other production conditions and examination methods were the same as those in Example 1-1. Various examination results are shown in Table 3 together with the production conditions of the SiO powder.

Example 5-i

In Example 5, the prepared final product (SiO fine powder) was subjected to heat treatment. Specifically, the final product (SiO fine powder) was loaded into a crucible made of alumina and heated in an electric furnace in an inert gas atmosphere (Ar gas atmosphere) at 850° C. for two hours. The other conditions were the same as those in Example 5. Various examination results are shown in Table 3 together with the production conditions of the SiO powder.

Example 5-ii

In Example 5-i, the final product (SiO fine powder) after heat treatment was coated with electrically conductive carbon (C-coating). Specifically, the powder after heat treatment was loaded into a rotary kiln, and carbon coating treatment was performed by a thermal CVD using a mixed gas of argon and propane as a carbon source. A carbon coating amount (weight ratio of the C element in relation to the entire powder) was 2 wt %. The other conditions were the same as those in Example 5-i. Various examination results are shown in Table 3 together with the production conditions of the SiO powder.

Example 6

In Example 5, the SiO gas-generating raw material was changed from a mixture of Si, $SiO_2$, and lithium silicate (Li:Si:O=0.1:1:1) to a mixture of Si, $SiO_2$, and MgO (Mg:Si:O=0.1:1:1). The other production conditions and examination methods were the same as those in Example 5. Various examination results are shown in Table 3 together with production conditions of the SiO powder.

Example 7

In Example 1-1, the rotation speed of the deposition base was reduced, the scraping period n was changed from 2.4 min$^{-1}$ to 0.08 min$^{-1}$, and accordingly, d/n was changed from 2 to 60. The other production conditions and examination methods were the same as those in Example 1-1. Various examination results are shown in Table 3 together with the production conditions of the SiO powder.

Comparative Example 1

In Example 1-1, a distance g from the surface of the deposition base to the tip of the blade was changed from 0.5 mm to 0 mm. In other words, the tip of the blade was brought into contact with the surface of the deposition base. The other production conditions and examination methods were the same as those in Example 1-1. Various examination results are shown in Table 3 together with the production conditions of the SiO powder.

Comparative Example 2

In Example 7, the distance g from the surface of the deposition base to the tip of the blade was changed from 0.5 mm to 0 mm. In other words, in Example 1-1, the rotation speed of the deposition base was reduced, the scraping period n was changed from 2.4 min$^{-1}$ to 0.08 min$^{-1}$, and accordingly, d/n was changed from 2 to 60; and the tip of the blade was brought into contact with the surface of the deposition base. The other production conditions and examination methods were the same as those in Example 7 or Example 1-1. Various examination results are shown in Table 3 together with the production conditions of the SiO powder.

TABLE 3

|   |   | Ex. 1-1 | Ex.1-2 | Ex.1-3 | Ex.2 | Ex.2-i | Ex.2-ii | Ex.3 | Ex.4 |
|---|---|---|---|---|---|---|---|---|---|
| A | Raw material | Si + SiO$_2$ | Si + SiO$_2$ | Si + SiO$_2$ | Si + SiO$_2$ | ← | ← | Si + SiO$_2$ | Si + SiO$_2$ |
|   | Base material temperature (° C.) | 150 | 150 | 150 | 150 | ← | ← | 150 | 500 |
|   | Pressure (Pa) | 1 | 1 | 1 | 1 | ← | ← | 1 | 1 |
|   | Reaction chamber temperature (° C.) | 1300 | 1300 | 1300 | 1300 | ← | ← | 1300 | 1300 |
|   | Film formation speed d (um/min) | 4.8 | 4.8 | 4.8 | 4.8 | ← | ← | 4.8 | 4.5 |
|   | Scraping period n (min$^{-1}$) | 2.4 | 0.24 | 48 | 2.4 | ← | ← | 2.4 | 2.4 |
|   | d/n (μm) | 2 | 20 | 0.1 | 2 |   |   | 2 | 1.875 |
|   | Distance g between deposition base and blade (mm) | 0.5 | 0.5 | 0.5 | 1 | ← | ← | 3 | 3 |
| B | SiO shape | spherical | spherical | spherical | spherical | ← | ← | spherical | spherical |
|   | Spherical SiO manufacturing capability (g/(hr · m)) | 114 | 114 | 114 | 114 | ← | ← | 114 | 114 |
|   | Yield | 96% | 95% | 95% | 89% | ← | ← | 85% | 84% |
|   | Powder collection rate | 95% | 94% | 99% | 97% |   |   | 94% | 95% |
|   | Circularity EPIA-3000 | 0.931 | 0.936 | 0.929 | 0.941 |   |   | 0.942 | 0.951 |
| C | Heat treatment atmosphere |   |   |   |   | At 1 atm |   |   |   |
|   | Heat treatment temperature |   |   |   |   | 850° C. |   |   |   |
|   | Carbon coating concentration |   |   |   |   |   | 2 wt % |   |   |
| D | O/Si (mol/mol) | 1.1 | 1.1 | 1.2 | 1.2 | 1.2 | 1.2 | 1.1 | 1.0 |
|   | O/O (mol/mol) | — | — | — | — | — | — | — | — |
|   | Mg/O (mol/mol) | — | — | — | — | — | — | — | — |
| E | Initial efficiency | 56.3% | 57.1% | 54.8% | 56.9% | 62.4% | 65.2% | 56.8% | 64.3% |
|   | Capacity retention rate after 50 cycles | 65.4% | 52.3% | 67.3% | 65.4% | 65.7% | 80.6% | 65.1% | 79.8% |
| F | Average fractal dimension Dfi of 20 particles | 1.050 | 1.020 | 1.285 | 1.220 | ← | ← | 1.200 | 1.370 |
| G | Average particle size through 45-μm sieve before pulverization (μm) | 25 | 30 | 15 | 25 | / | / | 23 | 26 |
|   | Average particle size after pulverization (μm) | 5 |   |   | 5 | / | / |   | 5 |
|   | Time required for pulverization (μm) | 10 |   |   | 8 | / | / |   | 5 |

|   |   | Ex. 5 | Ex.5-i | Ex.5-ii | Ex.6 | Ex.7 | Co.Ex.1 | Co.Ex.2 |
|---|---|---|---|---|---|---|---|---|
| A | Raw material | Si + SiO$_2$ + lithium silicate | ← | ← | Si + SiO$_2$ McO | Si + SiO$_2$ | Si + SiO$_2$ | Si + SiO$_2$ |
|   | Base material temperature (° C.) | 150 | ← | ← | 150 | 150 | 150 | 150 |
|   | Pressure (Pa) | 1 | ← | ← | 1 | 1 | 1 | 1 |
|   | Reaction chamber temperature (° C.) | 1300 | ← | ← | 1300 | 1300 | 1300 | 1300 |
|   | Film formation speed d (um/min) | 4.8 | ← | ← | 4.8 | 4.8 | 4.8 | 4.8 |
|   | Scraping period n (min$^{-1}$) | 2.4 | ← | ← | 2.4 | 0.08 | 2.4 | 0.08 |
|   | d/n (μm) | 2 | ← | ← | 2 | 60 | 2 | 60 |
|   | Distance g between deposition base and blade (mm) | 0.1 | ← | ← | 0.1 | 0.5 | 0 | 0 |
| B | SiO shape | spherical | ← | ← | spherical | substantially spherical | scale shape | scale shape |
|   | Spherical SiO manufacturing capability (g/(hr · m)) | 160 | ← | ← | 160 | 57 | — | — |
|   | Yield | 93% | ← | ← | 92% | 94% | 96% | 96% |
|   | Powder collection rate | 95% | ← | ← | 94% | 50% | 31.0% | 0.5% |
|   | Circularity EPIA-3000 | 0.949 |   |   | 0.937 | 0.849 | 0.701 | 0.732 |
| C | Heat treatment atmosphere |   | At 1 atm | ← |   |   |   |   |
|   | Heat treatment temperature |   | 850° C. | ← |   |   |   |   |
|   | Carbon coating concentration |   |   | 2 wt % |   |   |   |   |
| D | O/Si (mol/mol) | 1.0 | 1.0 | 1.0 | 1.0 | 1.2 | 1.1 | 1.1 |
|   | O/O (mol/mol) | 0.1 | 0.1 | 0.1 | — | — | — | — |
|   | Mg/O (mol/mol) | — | — | — | 0.1 | — | — | — |

TABLE 3-continued

| | | | | | | | | |
|---|---|---|---|---|---|---|---|---|
| E | Initial efficiency | 63.6% | 73.5% | 75.1% | 65.2% | 50.2% | 50.1% | 50.1% |
| | Capacity retention rate after 50 cycles | 71.0% | 75.5% | 82.0% | 65.7% | 55.1% | 52.2% | 51.1% |
| F | Average fractal dimension Dfi of 20 particles | 1.320 | ← | ← | 1.220 | 1.040 | 1.020 | 1.010 |
| G | Average particle size through 45-μm sieve before pulverization (μm) | 20 | / | / | 22 | 33 | 24 | |
| | Average particle size after pulverization (μm) | | / | / | | | 5 | |
| | Time required for pulverization (μm) | | / | / | | | 15 | |

Ex. = Example
Co. Ex = Comparative Example
A: Production conditions
B: Powder production result
C: Post treatment condition
D: Element ratio
E: Battery evaluation results
F: Particle cross-section fractal dimensional analysis
G: Pulverizability As can be seen from Table 3, in Examples of the present invention in which the tip of the blade is apart from the surface of the deposition base, as compared with Comparative Examples in which the tip of the blade was in contact with the surface of the deposition base, the capacity retention rate after 50 cycles as the battery performance is improved. This is considered to be because in Examples of the present invention, the contamination with an impurity by the SiO powder occurring when the tip of the blade is in contact with the surface of the deposition base is reduced.

Figure 2:
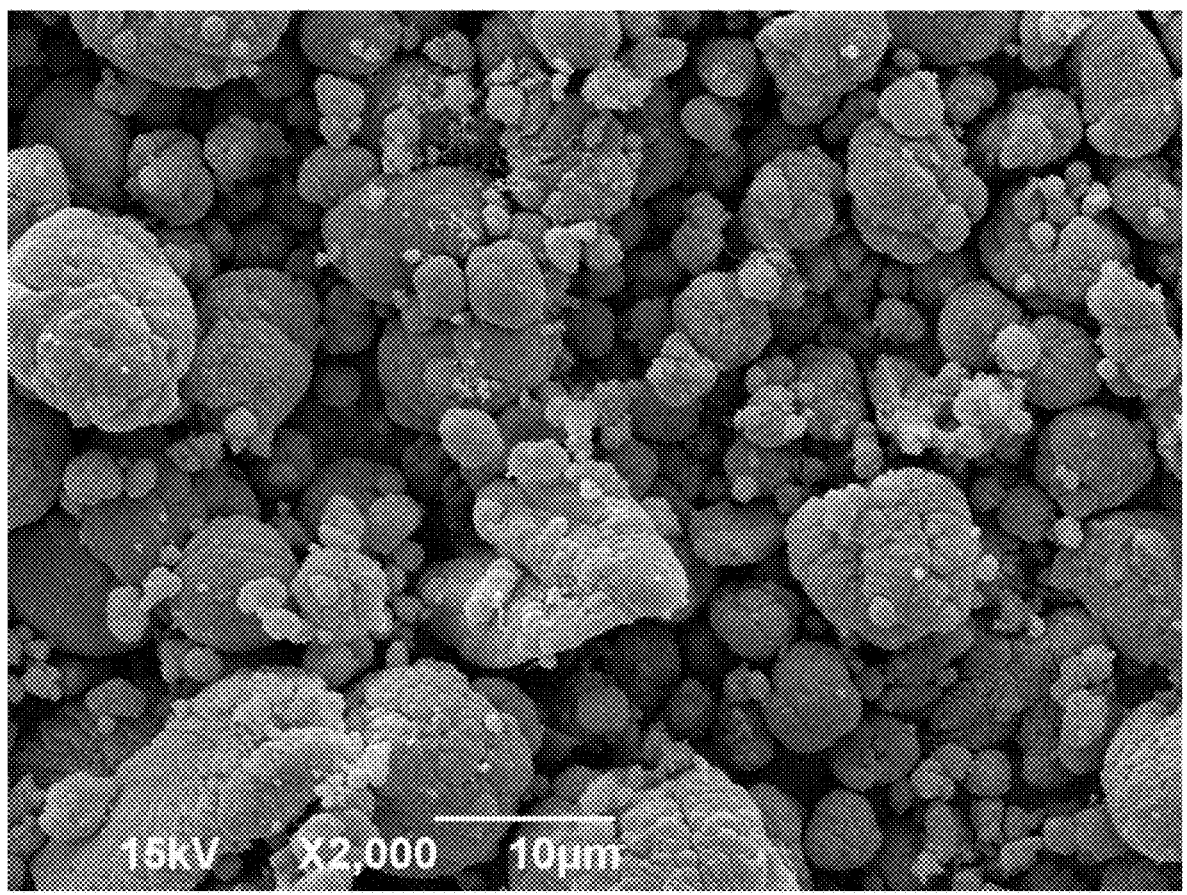
FIG. 2 is a micrograph of an SiO powder produced by the method of the present invention.
Figure 3:
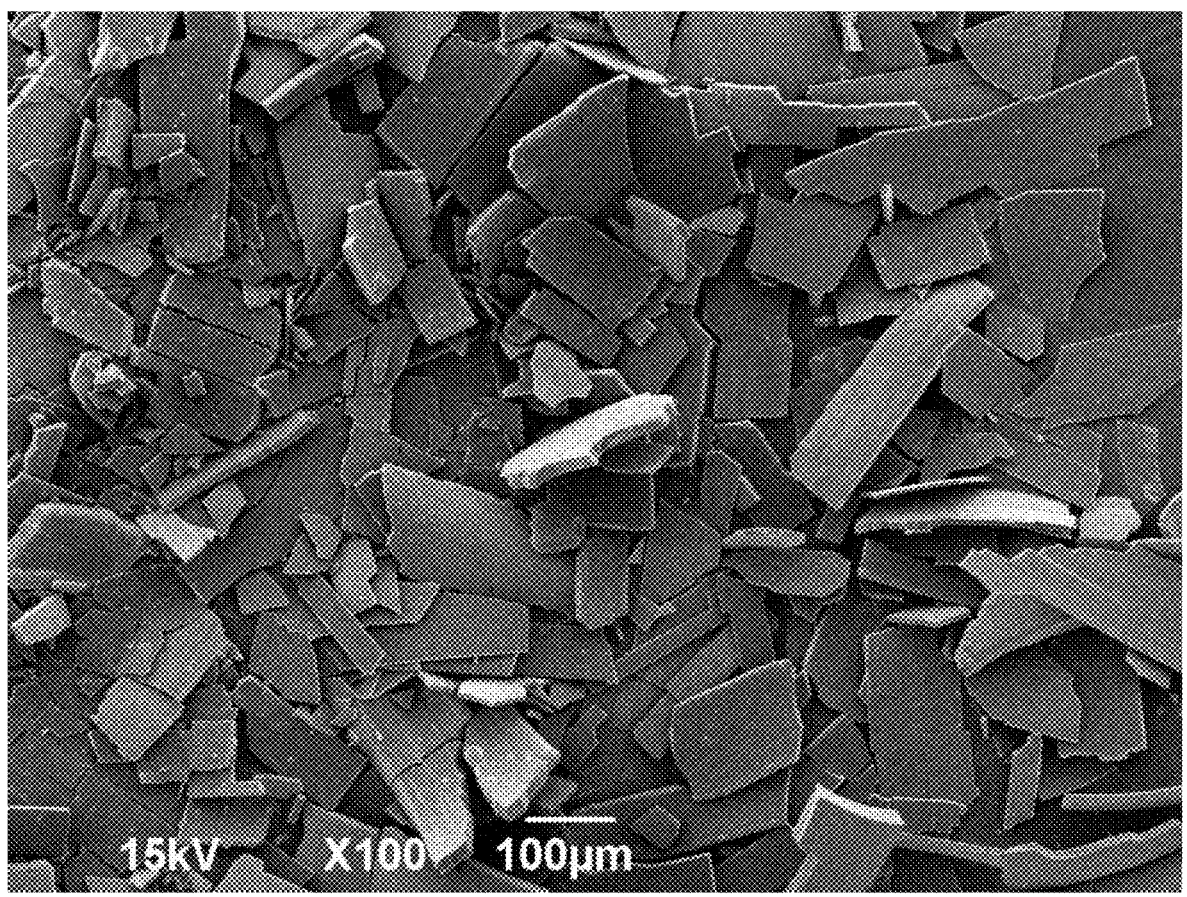
FIG. 3 is a micrograph of an SiO powder produced by a conventional method as a comparison.
Figure 4:
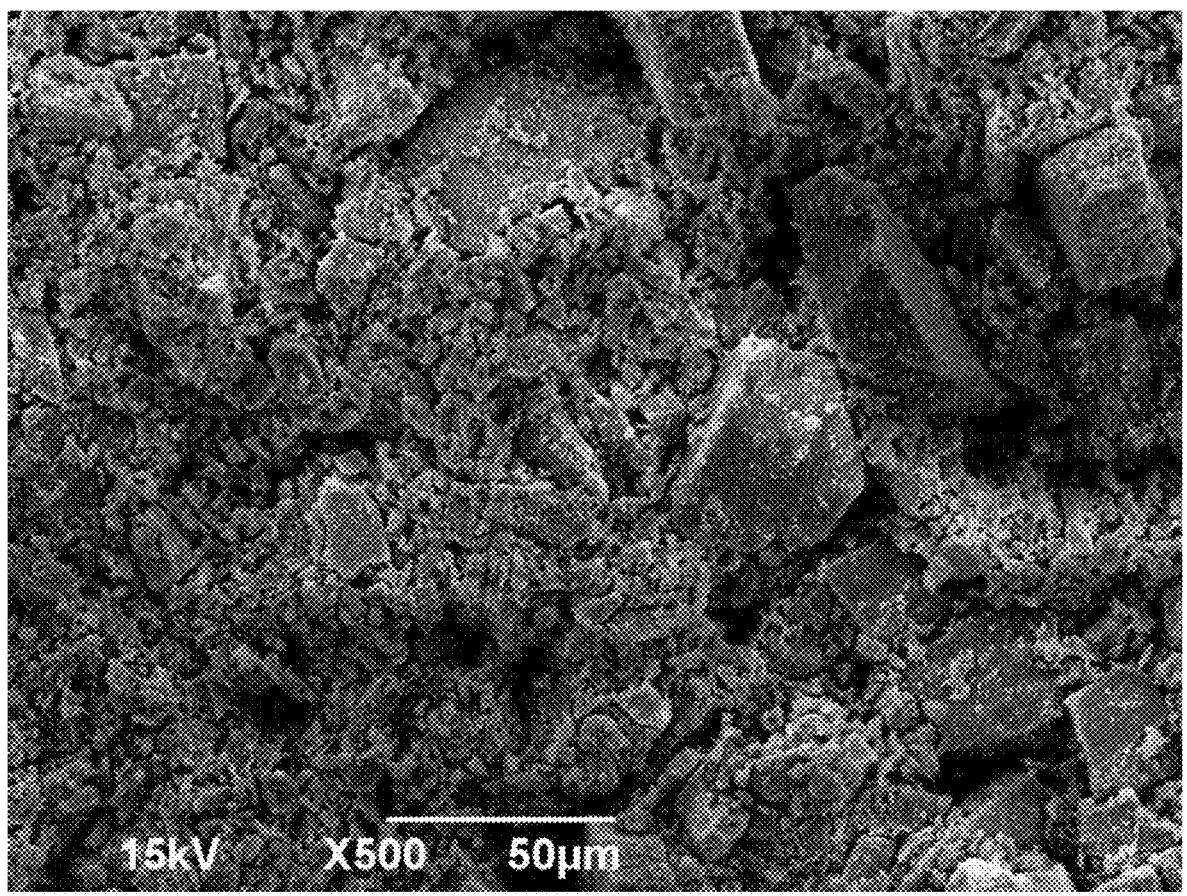
FIG. 4 is a micrograph of an SiO powder produced by the conventional method after pulverization.

Furthermore, regarding the particle shape of the SiO powder, the circularity was less than 0.8 and the shape was a scale-shape in Comparative Examples 1 and 2, while in the Examples of the present invention, the circularity was as high as 0.8 or more, and except for Example 7, all of the shapes were spherical shapes having a particularly high circularity of 0.9 or more. A micrograph of SiO powder (collected powder before sieving) produced in Example 1-1 is shown in FIG. 2. Furthermore, a micrograph of SiO powder (collected powder before sieving) produced in Comparative Example 1 is shown in FIG. 3, and a state of the pulverized powder is shown in FIG. 4.

It was found that the SiO powder produced in Example 1-1 was a rounded spherical particulate powder. Furthermore, it was found that the SiO powder produced in Example 1-1 grew to a composite spherical shape like a cauliflower, so to speak, in which a plurality of small spherical satellite parts were integrally combined into a large spherical core part serving as a core. On the other hand, an SiO powder produced in Comparative Example 1 had a clear scale-shape. Even if the SiO powder is pulverized, it does not become rounded spherical particulate powders as those produced in Example 1-1.

The reason why the circularity in Example 7 was lower than the circularity in other Examples and became substantially spherical particulate is that because the rotation speed of the deposition base was slow and therefore the scraping period n was very short at 0.08 min$^{-1}$, and the time from one scraping to the next scraping was longer, new SiO deposit accumulated on the remaining SiO deposit and the SiO deposit remaining below were integrated with each other, and the SiO powder obtained by scraping became scale-shaped. Consequently, the SiO powder in two forms, that is, a spherical particulate and a relatively large scale-shaped shape, was peeled off from the deposition base, a spherical particulate powder could be collected by sieving, and the circularity of the spherical particle powder was higher than those of Comparative Examples as described above.

Then, since rounded spherical particulate powders were obtained in the other Examples excluding Example 7, the initial efficiency as the battery performance was greatly improved as compared with Comparative Examples and Example 7.

Furthermore, the fine powder collecting rate in the production of the SiO powder was high. This means that fine pulverization had already proceeded in the stage of scraping with a blade and collecting.

In Examples 2,2-i, 2-ii, 3, and 4, as compared with the other Examples, the yield slightly decreased because the distance from the surface of the deposition base to the tip of the blade was not necessarily optimum.

Furthermore, as is seen from Examples 2-i, 2-ii, 5-i, and 5-ii, the heat treatment with respect to the collected SiO powder is effective in the improvement of the initial efficiency, and coating with electrically conductive carbon is effective in the improvement of the capacity retention rate after 50 cycles. In particular, Example 4 shows relatively high initial efficiency and capacity retention rate after 50 cycles although neither heat treatment on the SiO powder nor coating with electrically conductive carbon were performed. This is thought to be because the temperature of the deposition base was higher than the others, and the film formation speed was suppressed, while the organization of the SiO deposit tended to be dense, and this is reflected in the battery evaluation. The organization became dense even with heat treatment on the collected SiO powder (Example 2-i), but more importantly, the battery performance was further improved. This is thought to be because the amount of oxygen to be picked up is less under heating in the state of non-exposure to air than under heating after exposure to air after collection.

Furthermore, as seen in Examples 5 and 6, Li dope and Mg dope in which the raw material includes a dope source are effective in improvement of the battery performance, and heat treatment and coating with electrically conductive carbon thereon are also effective in improvement of the battery performance (Examples 5-i and 5-ii).

Figure 5A:
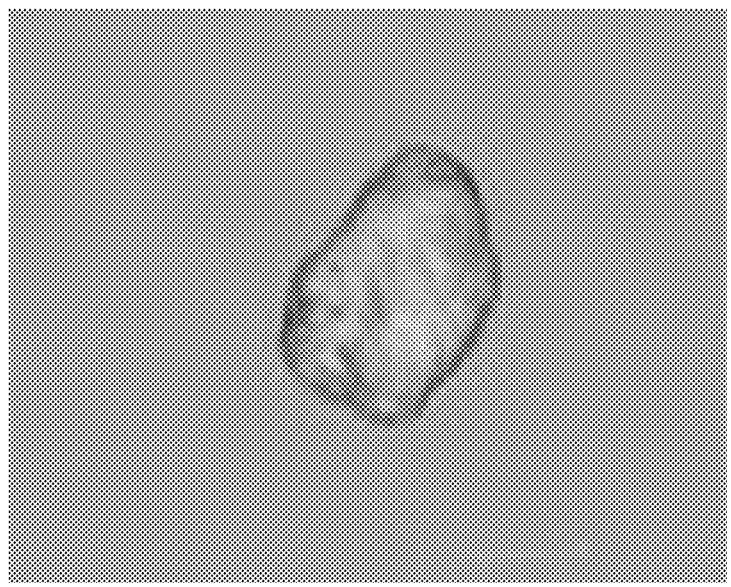
FIG. 5A is a three-dimensional reconstruction image of an SiO powder particle of the present invention.
Figure 5B:
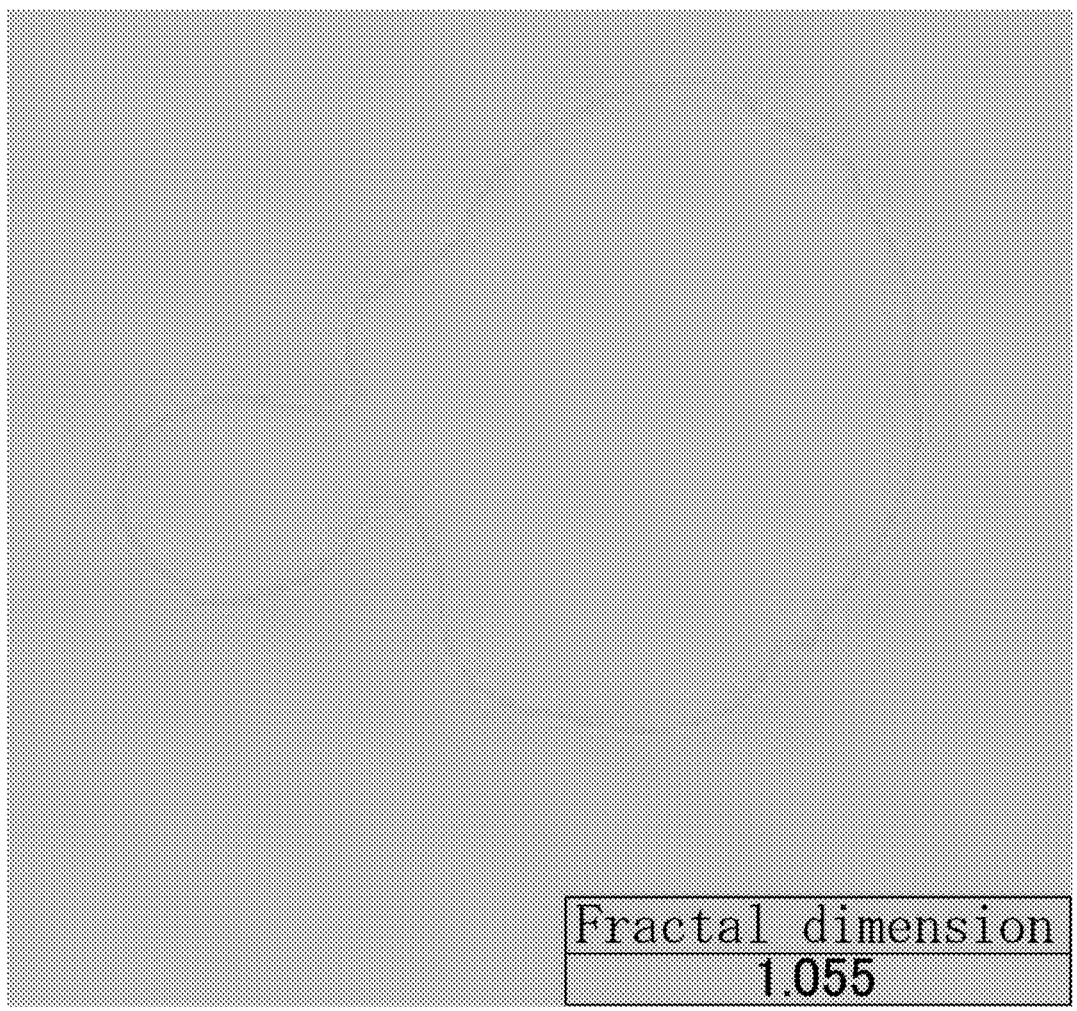
FIG. 5B is a cross-sectional image of the powder particle.
Figure 6A:
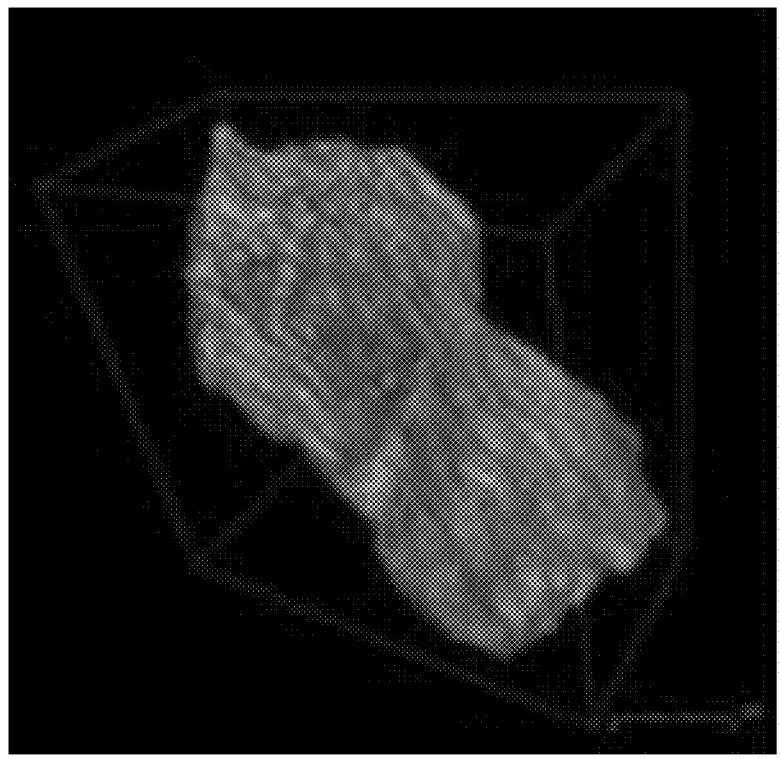
FIG. 6A is a three-dimensional reconstruction image of a conventional SiO powder particle of the present invention.
Figure 6B:
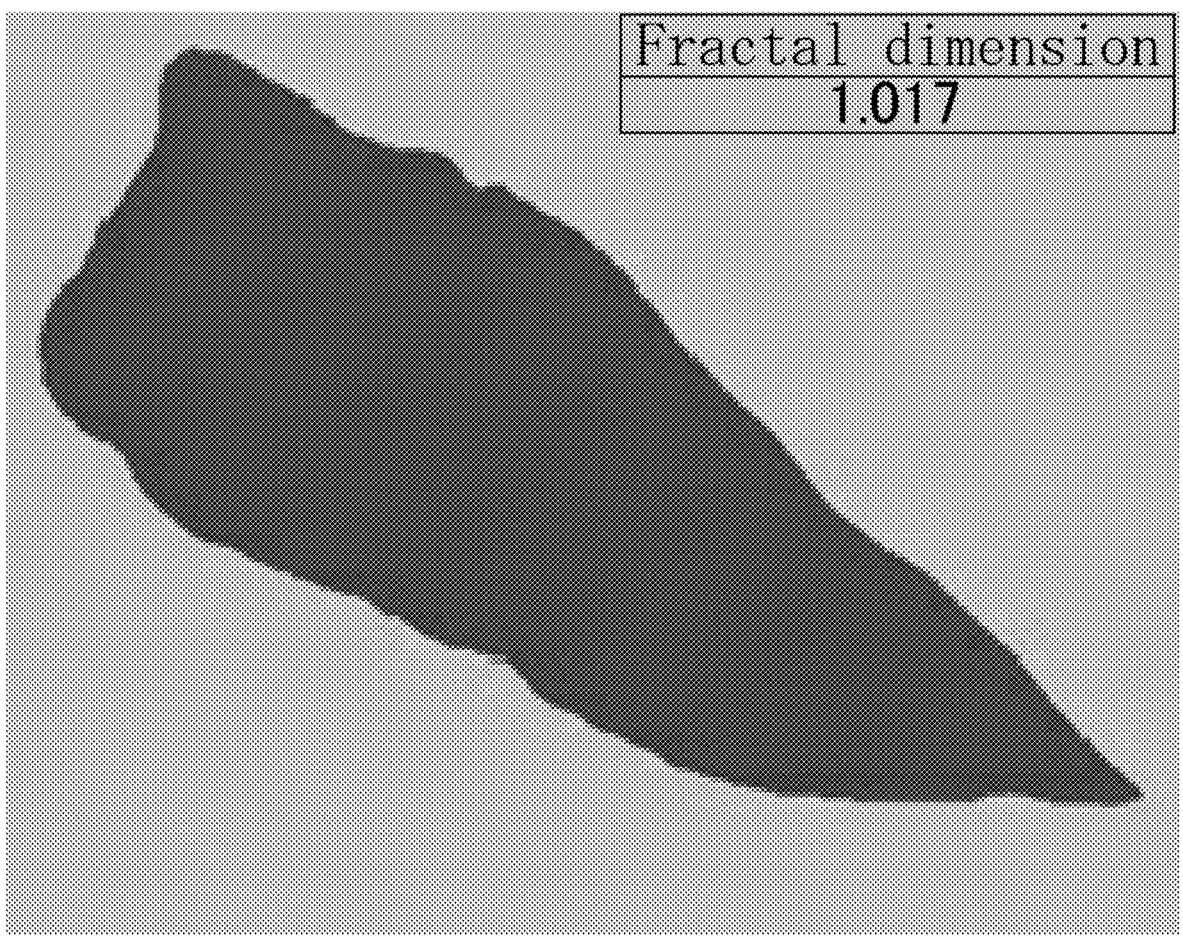
FIG. 6B is a cross-sectional image of the powder particle.

When particle shapes in Examples and Comparative Examples are evaluated based on the average value Dfi of the fractal dimension D of 20 particles, the values fall in the range of 1.03 or more and 1.50 or less in the Examples, while they are less than 1.03 in the Comparative Examples. The three-dimensional reconstruction image of one particle in the SiO powder obtained in Example 1-1 is shown in FIG. 5A, and the cross-sectional image thereof is shown in FIG. 5B. The fractal dimension D of the cross-sectional image is 1.055. Furthermore, the three-dimensional reconstruction image of one particle in the SiO powder obtained in Comparative Example 1-1 is shown in FIG. 6A, and the cross-sectional image thereof is shown in FIG. 6B. The fractal dimension D of the cross-sectional image is 1.017, which is clearly different from that obtained in Example 1-1.

Figure 7:
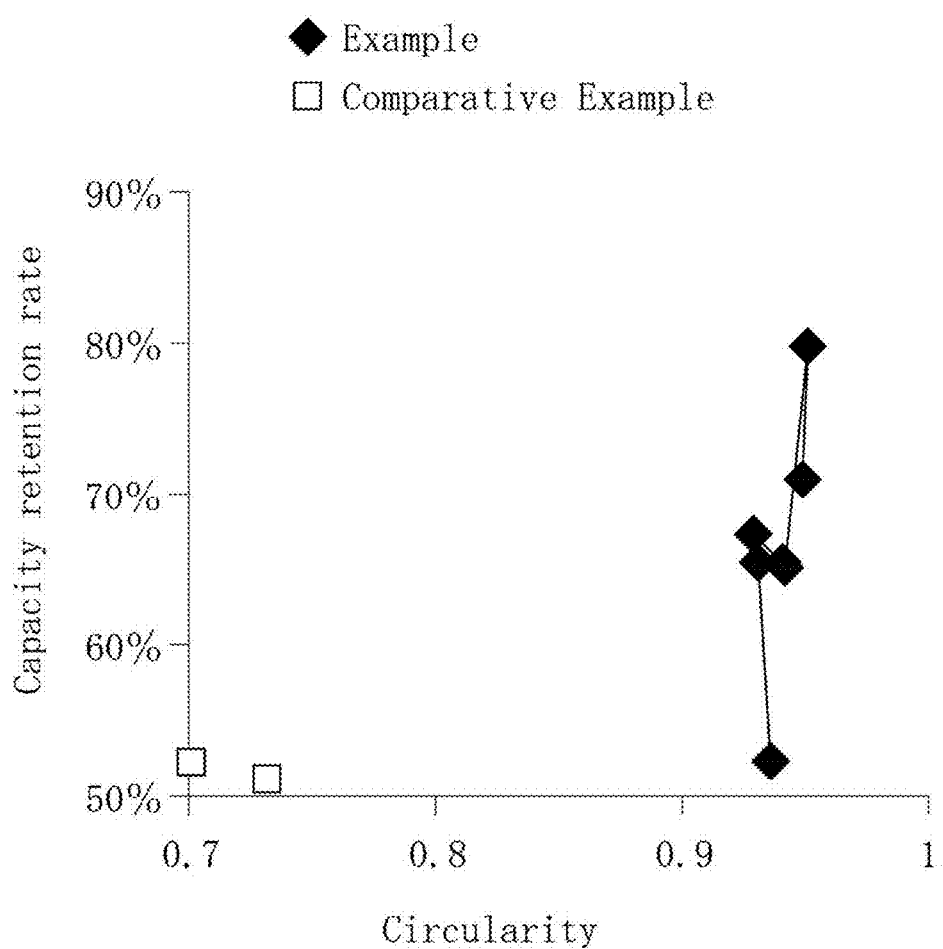
FIG. 7 is a graph showing the relationship between the circularity of the particle and the cycle characteristics of the powder.
Figure 8:
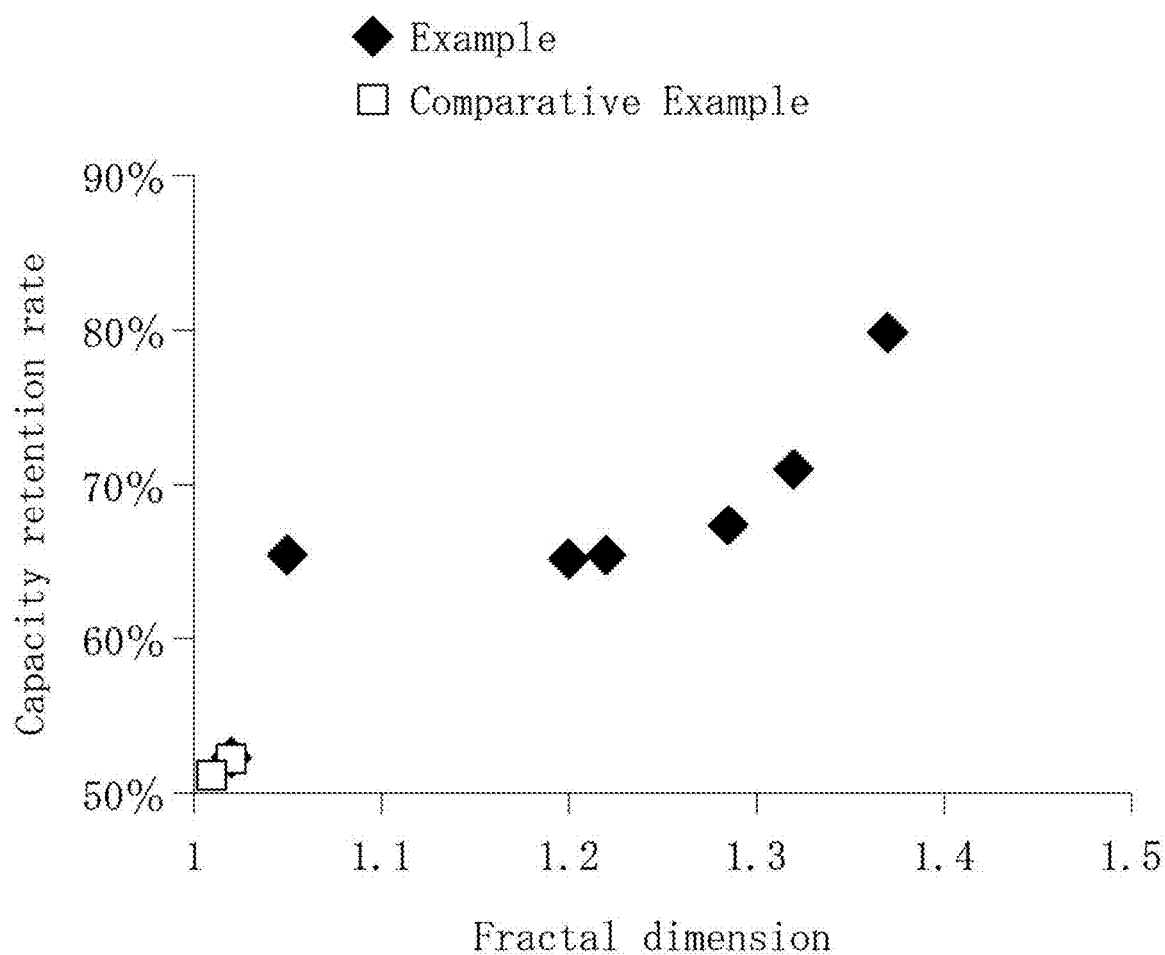
FIG. 8 is a graph showing the relationship between a fractal dimension Dfi and the cycle characteristics of the powder.

FIG. 7 shows the relationship between the circularity and the capacity retention rate (cycle characteristics) after 50 cycles in the Examples and Comparative Examples. FIG. 8 shows the relationship between the average value Dfi of the fractal dimension D and the capacity retention rate (cycle characteristics) after 50 cycles in the Examples and Comparative Examples.

As can be seen from FIG. 7, Examples having high circularity show improvement of the capacity retention rate, but do not show monotonous correlation. Therefore, it is difficult to say that control is possible with circularity. On the contrary, as can be seen from FIG. 8, the fractal dimension D shows a strong correlation with the capacity retention rate, and the capacity retention rate can be controlled by the fractal dimension D. This is thought to be because the fractal dimension D exactly reflects a characteristic feature of the composite spherical shape like a cauliflower, so to speak, in which a plurality of small spherical satellite parts are integrally combined into a large spherical core part serving as a core.

Figure 9:
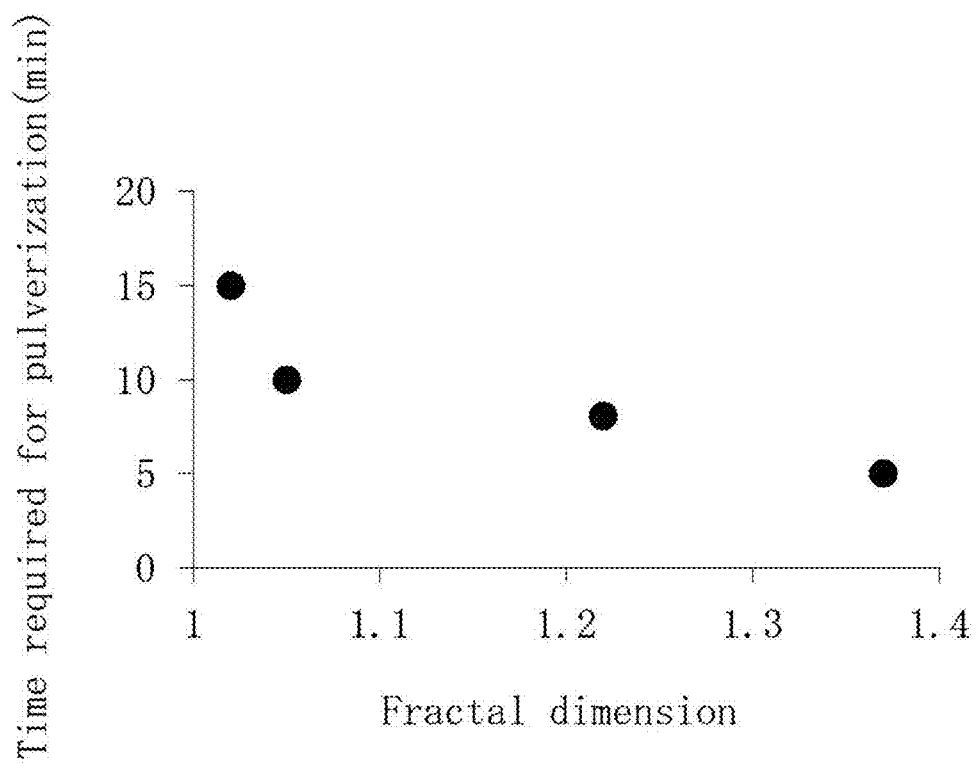
FIG. 9 is a graph showing the relationship between a fractal dimension Dfi and the time required for pulverization (pulverizability) of particles of the powder.

Furthermore, FIG. 9 shows the relationship between the average value Dfi of the fractal dimension D and the time required for pulverization (pulverizability) in the Examples and Comparative Examples. As is apparent from FIG. 9, the larger the average value Dfi of the fractal dimension becomes, the more the pulverizability is improved. This also shows that the fractal dimension D is effective in the evaluation of the quantitative evaluation of the characteristic feature of particles having a composite spherical shape like a cauliflower.

Note here that in the present invention, SiO does not mean SiOx (x=1). It means SiO in a broad sense, and encompasses SiO doped with any other elements. If it is represented by the chemical formula, it is MySiOx wherein $0.5 \leq x \leq 1.5$ and $0 \leq y \leq 1$ are satisfied. Herein, x, that is, the rate of O atomic weight with respect to the Si atomic weight, is less than 0.5, SiOx is too close to Si, activity with respect to oxygen increases, and safety is deteriorated. On the contrary, when x is more than 1.5, the initial efficiency is deteriorated, and the battery performance may be deteriorated.

x and y further preferably satisfy $0.05 \leq y/x \leq 1$. When y/x is less than 0.05, the effect of doping M is minimal. When y/x is more than 1, safety is deteriorated.

In each of the above-described Examples and Comparative Examples, each element amount of Si, O, and Li or Mg in the obtained SiO powder was measured. For Si, Li, and Mg, the element amount was measured by the ICP luminescent spectroscopy. For O, an element amount was measured by the Inert gas melting-infrared absorption method (GFA) using TC-436 manufactured by LECO. The O/Si element ratio, the Li/O element ratio, and the Mg/O element ratio in each Example are shown together in Table 3.

1 furnace body
2 crucible
3 heater
4 heat insulator
5 deposition base
7 blade
8 saucer
9 SiO gas-generating raw material
10 SiO deposit
11 SiO powder

The invention claimed is:

1. A method for producing an SiO powder, the method comprising:
   accumulating SiO gas on a cooled deposition base; and
   continuously scraping off an SiO deposit accumulated on the deposition base with a blade and collecting the scraped SiO deposit,
   wherein the blade is separated from the deposition base, and thereby an SiO deposition layer is left on the deposition base in a position for scraping with the blade even after scraping with the blade, an SiO gas is further deposited in a particulate form on the SiO deposition layer left on the position for scraping on the deposition base, and the particulate SiO deposited on the SiO deposition layer is continuously scraped off with the blade and collected as powder by continuous scraping with the blade.

2. The method for producing an SiO powder according to claim 1, wherein a distance from the deposition base to the blade is made constant, and scraping is repeated over a constant period.

3. The method for producing an SiO powder according to claim 2, wherein a ratio d/n (μm) of an accumulation rate, that is, a growth rate d (μm/min)) of the SiO deposit on the deposition base to a scraping period n (1/min) is 0.5 to 20 μm.

4. The method for producing an SiO powder according to claim 1, wherein a distance g (mm) from the deposition base to the blade is 0.1 to 3 mm.

5. The method for producing an SiO powder according to claim 1, wherein an element M other than Si and O is added to an SiO gas-generating raw material so as to produce an SiO powder doped with the element M.

6. The method for producing an SiO powder according to claim 5, wherein the element M is a metallic element.

7. The method for producing an SiO powder according to claim 6, wherein addition of the element M to the SiO gas-generating raw material is performed by mixing oxide of M or silicate into the raw material.

8. The method for producing an SiO powder according to claim 1, wherein the collected SiO powder is heated in an inert gas atmosphere.

9. The method for producing an SiO powder according to claim 1, wherein the collected SiO powder is further pulverized.

10. The method for producing an SiO powder according to claim 1, wherein the collected SiO powder is coated with electrically conductive carbon.

* * * * *